United States Patent
Cotte et al.

(10) Patent No.: US 8,263,492 B2
(45) Date of Patent: Sep. 11, 2012

(54) THROUGH SUBSTRATE VIAS

(75) Inventors: John Michael Cotte, New Fairfield, CT (US); Christopher Vincent Jahnes, Upper Saddle River, NJ (US); Bucknell Chapman Webb, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 12/432,243

(22) Filed: Apr. 29, 2009

(65) Prior Publication Data

US 2010/0276786 A1 Nov. 4, 2010

(51) Int. Cl.
*H01L 21/768* (2006.01)
*H01L 23/48* (2006.01)

(52) U.S. Cl. ........ 438/667; 438/624; 438/692; 438/778; 257/621; 257/758; 257/E23.011; 257/E21.597

(58) Field of Classification Search .................. 438/667; 257/621, E23.011
See application file for complete search history.

(56) References Cited

U.S. PATENT DOCUMENTS

| | | | |
|---|---|---|---|
| 6,322,903 B1 * | 11/2001 | Siniaguine et al. | 428/617 |
| 6,498,381 B2 * | 12/2002 | Halahan et al. | 257/449 |
| 6,521,530 B2 | 2/2003 | Peters et al. | |
| 7,034,401 B2 | 4/2006 | Savastiouk et al. | |
| 7,186,586 B2 | 3/2007 | Savastiouk et al. | |
| 7,225,538 B2 | 6/2007 | Eldridge et al. | |
| 7,241,641 B2 * | 7/2007 | Savastiouk et al. | 438/106 |
| 7,317,256 B2 | 1/2008 | Williams et al. | |
| 2005/0189636 A1 | 9/2005 | Savastiouk et al. | |
| 2006/0278989 A1 * | 12/2006 | Trezza | 257/773 |
| 2007/0048896 A1 * | 3/2007 | Andry et al. | 438/106 |
| 2007/0069364 A1 | 3/2007 | Kawano et al. | |
| 2008/0032457 A1 | 2/2008 | McWilliams et al. | |
| 2008/0079150 A1 | 4/2008 | Simon et al. | |
| 2008/0122031 A1 * | 5/2008 | DeNatale et al. | 257/532 |
| 2008/0237781 A1 | 10/2008 | Uchiyama | |
| 2009/0057899 A1 * | 3/2009 | Cheon et al. | 257/738 |
| 2009/0130846 A1 * | 5/2009 | Mistuhashi | 438/667 |

FOREIGN PATENT DOCUMENTS

| | | |
|---|---|---|
| DE | 10205026 C1 | 5/2003 |
| WO | 2009/050207 A1 | 4/2009 |
| WO | WO 2009050207 A1 * | 4/2009 |
| WO | PCT/EP2010/055867 | 6/2010 |

OTHER PUBLICATIONS

Masahiro Sekiguchi, Hideo Numata, Ninao Sato, Tatsuhiko Shirakawa, Mie Matsuo, Hiroshi Yoshikawa, Mitsuhiko Yanagida, Hideo Nakayoshi, Kenji Takahashi; Novel low cost integration of through chip interconnection and application to cmos image sensor; IEEE: Electronic Components and Technology Conference (ECTC), Jul. 5, 2006; p. 1367-1374.*

* cited by examiner

*Primary Examiner* — N Drew Richards
*Assistant Examiner* — John P Dulka
(74) *Attorney, Agent, or Firm* — Daniel P. Morris; Ryan, Mason & Lewis, LLP (57) ABSTRACT

Methods and apparatus for forming through-vias are presented, for example, a method for forming a via in a portion of a semiconductor wafer comprising a substrate. The method comprises forming a trench surrounding a first part of the substrate such that the first part is separated from a second part of the substrate, forming a hole through the substrate within the first part, and forming a first metal within the hole. The trench extends through the substrate. The first metal extends from a front surface of the substrate to a back surface of the substrate. The via comprises the hole and the first metal.

1 Claim, 10 Drawing Sheets

THROUGH SUBSTRATE VIAS

FIELD OF THE INVENTION

The present invention relates generally to integrated circuits and interposers. More particularly the invention relates to through wafer substrate vias formed within integrated circuits and interposers.

BACKGROUND OF THE INVENTION

An interposer is a die or integrated circuit (IC) used to interface routing between other dies, ICs or between a die or IC and a package substrate. An interposer may comprise wiring, through-vias, and pads. Additionally, an interposer may comprise active electronic devices or circuits. Conventional through-vias are vias that extend entirely through the semiconductor wafer or die, and are coupled to contacts on the front surface and the back surface of the wafer or die. Through-vias within silicon wafers or dies are called through-silicon-vias (TSVs).

Three-dimensional ICs may comprise a number of thinned dies stacked one upon another with inter-die connection comprising through-vias. The three-dimensional ICs are capable of high-density and high performance and can result in cost savings.

Sensors and other ICs comprising devices or circuits may be bonded onto interposers comprising through-vias to couple to nodes within the sensors and the active ICs. The nodes may be coupled to, for example, packaging substrates or other devices and circuits.

Conventional through-vias comprise holes, through the wafer or die, formed by etching into the wafer from the front surface of the wafer. The conventional through-vias are formed prior to forming wiring, devices or circuits on the front surface of the wafer, or, alternately, the conventional through-vias are formed after forming the wiring, devices or circuits on the front surface of the wafer, and comprise holes through the wiring, devices or circuits.

SUMMARY OF THE INVENTION

Principles of the invention provide, for example, through-substrate-vias formed from the backside of a wafer substrate after wiring, devices or circuits have been fabricated upon the front surface of the substrate, and optionally, the substrate has been thinned. An aspect of the invention is, for example, an isolating trench that extends through the substrate and surrounds, but is separate from, the through-substrate-via. The trench divides at least a portion of the substrate into an island part and a main part. The through-substrate-via is formed within the island part. The island part is electrically isolated from the main part by the trench.

For example, in accordance with one aspect of the invention, a method is provided for forming a via in a portion of a semiconductor wafer comprising a substrate. The method comprises forming a trench surrounding a first part of the substrate such that the first part is separated from a second part of the substrate, forming a hole through the substrate within the first part, and forming a first metal within the hole. The trench extends through the substrate. The first metal extends from a front surface of the substrate to a back surface of the substrate. The via comprises the hole and the first metal.

In accordance with another aspect of the invention, a via structure is provided. The via structure is formed in a portion of a semiconductor wafer comprising a substrate. The via structure comprises a first part of the substrate, a hole through the substrate and within the first part, and a first metal within the hole. A trench surrounds the first part such that the first part is separated from a portion of the substrate. The trench extends through the substrate. The first metal extends from a front surface of the substrate to a back surface of the substrate.

An advantage of the invention is, for example, vias that extend through the substrate and couple to wiring, device or circuit nodes previously formed in a portion of the wafer directly above the vias, thus allowing wiring, devices and circuits above the vias. For example, semiconductor sensor pixels can be back-contacted by vias below the active pixels. Further advantages include semiconductor area savings and consequent cost savings.

These and other features, objects and advantages of the present invention will become apparent from the following detailed description of illustrative embodiments thereof, which is to be read in connection with the accompanying drawings.

DETAILED DESCRIPTION OF THE INVENTION

It is to be understood that the term via will be used herein to mean a through-substrate-via, that is, a via extending through the substrate of a wafer from a front surface of the substrate to a back surface of the substrate.

Plating of copper onto silicon substrates may be performed by a damascene electro-plating process comprising the deposition of a liner and a seed layer. The liner acts as a diffusion barrier between the second copper plated metal and the silicon. The liner may comprise a Tantalum Nitride/Tantalum (TaN/Ta) bi-layer. The seed layer may comprise copper. The liner and seed layer may be deposited by physical vapor deposition (PVD). The seed layer acts as the cathode for the electro-plating. Optionally, small amounts of organic material can be added to the seed layer to increase the plating rate. Adding the organic material allows differential-rate plating, super-filling, super-conformal or bottom-up plating.

A wafer comprises a substrate and, optionally, a front surface layer. The substrate comprises, for example, a silicon or other semiconductor wafer substrate. The front surface layer comprises, for example, wiring, devices and circuits formed upon the substrate. Alternately, the front surface layer may not include wiring, devices or circuits. The wiring devices and circuits may reside entirely within the front surface layer or partially within the front surface layer and partially within the substrate. For example, a field effect transistor may have source, drain and channel regions within the substrate and gate, gate insulator and contacts within the front surface layer. It should be noted that wiring, devices and circuits entirely within the substrate are also possible.

Front side trenches are sometimes formed into the substrate. The front side trenches are formed extending from the surface of the substrate adjacent to the front surface layer. The front side trenches may be formed prior to the formation of the front surface layer. Alternately, the front side trenches are formed after the formation of the front surface layer, usually involving etching through the front surface layer. As examples, front side trenches may be used for electrical isolation, such as shallow trench isolation (STI), or used for a trench dynamic random access memory (DRAM) cell.

Of particular interest for the invention are front side trenches that are at least partially filled with insulator, such as silicon dioxide, and abut a via formed according to methods of the invention. Such front side trenches are considered extensions of the front surface layer that extend into the substrate and therefore are termed extension trenches. Thus, the extension trenches are considered part of the front surface layer and not part of the substrate. In this case, the front surface of the substrate is not coplanar but is on more than one geometric plane. A first portion of the front surface of the substrate comprises the front surface of the substrate excluding any substrate surfaces abutting the extension trench. The first portion of the front surface of the substrate resides within a first plane. A second portion of the front surface of the substrate is that surface of the substrate abutting the bottom of the extension trench. A third portion of the front surface of the substrate is that surface of the substrate abutting the sides of the extension trench. Extension trenches may comprise, for example, trenches used for STI.

The substrate, for example, may or may not comprise layers in addition to a first semiconductor layer. The layers in addition to the first semiconductor layer are typically layers attached to the back surface of the first semiconductor layer. For example, silicon-on-insulator (SOI) wafers comprise a first silicon semiconductor layer layered on top of an insulator layer, which is optionally layered on top of a second silicon layer. The insulator comprises, for example, silicon dioxide or sapphire. For wafers comprising layers in addition to the first semiconductor layer, the substrate of some embodiments of the invention does not comprise the layers in addition to the first semiconductor layer. For other embodiments of the invention, the substrate does comprise one or more of the layers in addition to the first semiconductor layer. The substrate may or may not be electrically conductive, or may or may not comprise portions that are electrically conductive.

Methods for forming wiring, devices and circuits upon semiconductor substrates are known in the art of integrated circuits and the manufacture thereof.

An aspect of the present invention is, for example, through-substrate-vias (vias) formed from the backside of a wafer after the wafer has been processed and, optionally, thinned. The processing has formed, for example, wiring, devices and/or circuits on a front surface layer above the front surface of a substrate portion of the wafer. For example, devices formed are transistors, resistors, capacitors, inductors and sensors. Examples of sensors include optical sensors for cameras.

Because the via is an electrical conductor, it should be isolated from unintentional coupling to other electrical conductors or nodes within an interposer, IC or wafer, while providing a good, low-resistance, electrical coupling between intentionally coupled nodes, for example, an intentionally coupled node on or within the front of the wafer and an intentionally coupled node on the back of the wafer. Thus, the via should be isolated from at least a portion of the substrate of the wafer wherein the via resides.

An aspect of the invention is an isolating trench that extends through the substrate and surrounds, but is separate from, the via. The trench divides a wafer, or a portion of a wafer, into an island part and a main part. The via is formed within the island part. The island part is electrically isolated from the main part by the trench.

Figure 1:
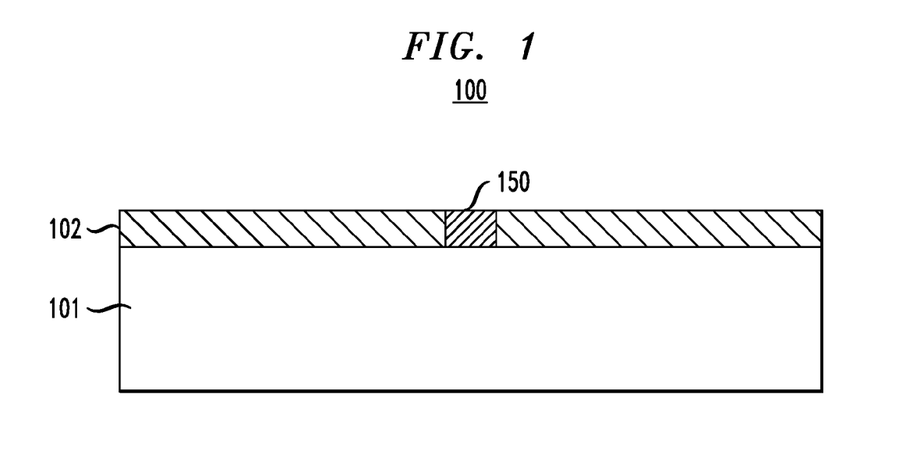
FIG. 1 illustrates a cross-section of a semiconductor wafer comprising a substrate and a front surface layer, according to an embodiment of the invention.

FIG. 1 illustrates a cross-section of a semiconductor wafer 100, according to an embodiment of the invention. The wafer 100 comprises a substrate 101 and a front surface layer 102 formed upon the front side of the substrate. In a simple embodiment, the front surface layer comprises an insulator surrounding a front contact 150. In another embodiment, the front surface layer comprises, in addition to the front contact 150, one or more levels of metal with intervening insulators. Wiring, power and ground planes, power and ground busses and/or contact pads may be formed within the metal levels. A more complex embodiment additionally comprises passive electronic components, for example, resistors, capacitors and inductors, and/or active electronic components, for example, transistors and diodes.

In any case, the front surface layer 102 comprises the front contact 150, the bottom of which is adjacent to the substrate 101. The embodiment shown in FIG. 1 has the front contact 150 extending through the front surface layer 102. In a different embodiment the front contact 150 does not extend through the front surface layer 102 to the top surface of the front surface layer 102. In either embodiment, the front contact 150 may optionally couple to a node (not shown) within the front surface layer 102, for example, a power or ground node, a signal node, or a node of a circuit comprising the passive and/or active electronic components. In some embodiments, the front contact 150 couples to a pad (not shown) on the top surface of the front surface layer 102. Yet other embodiments comprise a plurality of front contacts 150.

Wafer 100 may be a wafer of standard thickness or a thinned wafer. For a thinned wafer, typically after the front surface layer 102 is formed, the wafer is thinned by mechanical abrasion of the back surface of the wafer. Thinned wafers may be, for example, as thin as 100 µm, or even as thin as 10 µm. Thinned wafers are useful, for example, to provide thinned dies for three-dimensional ICs. The thinned dies enable a lower height of the three-dimensional IC. The thinned die may comprise through-substrate-vias for interconnect between the dies. Thinned dies have shorter through-substrate-vias than through-substrate-vias within thicker dies. Therefore, there is less parasitic capacitance associated with the through-substrate-vias of thinned dies than there is for through-substrate-vias within thicker dies. Consequently, thinned dies are capable of providing faster circuit operation than thicker dies.

Figure 12:
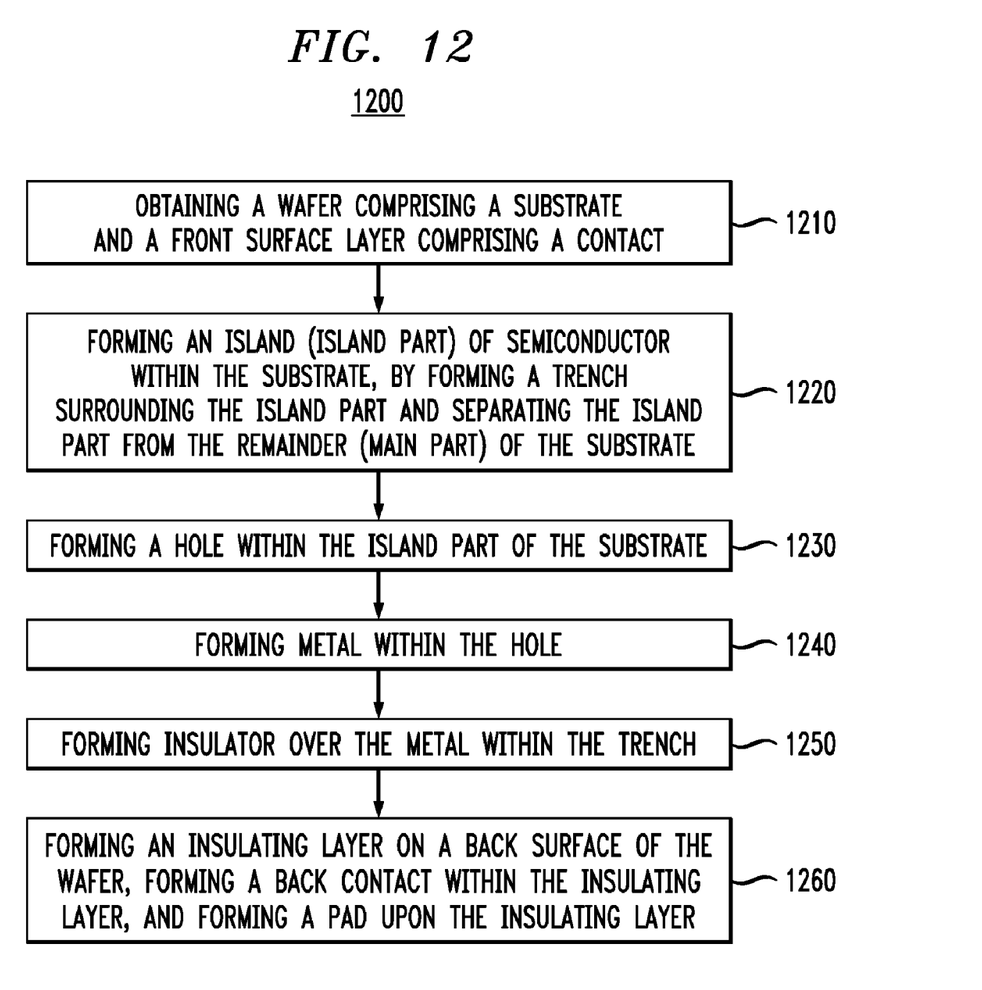
FIG. 12 details the steps of a general method for forming a through-via according to a general embodiment of the invention.
Figure 13:
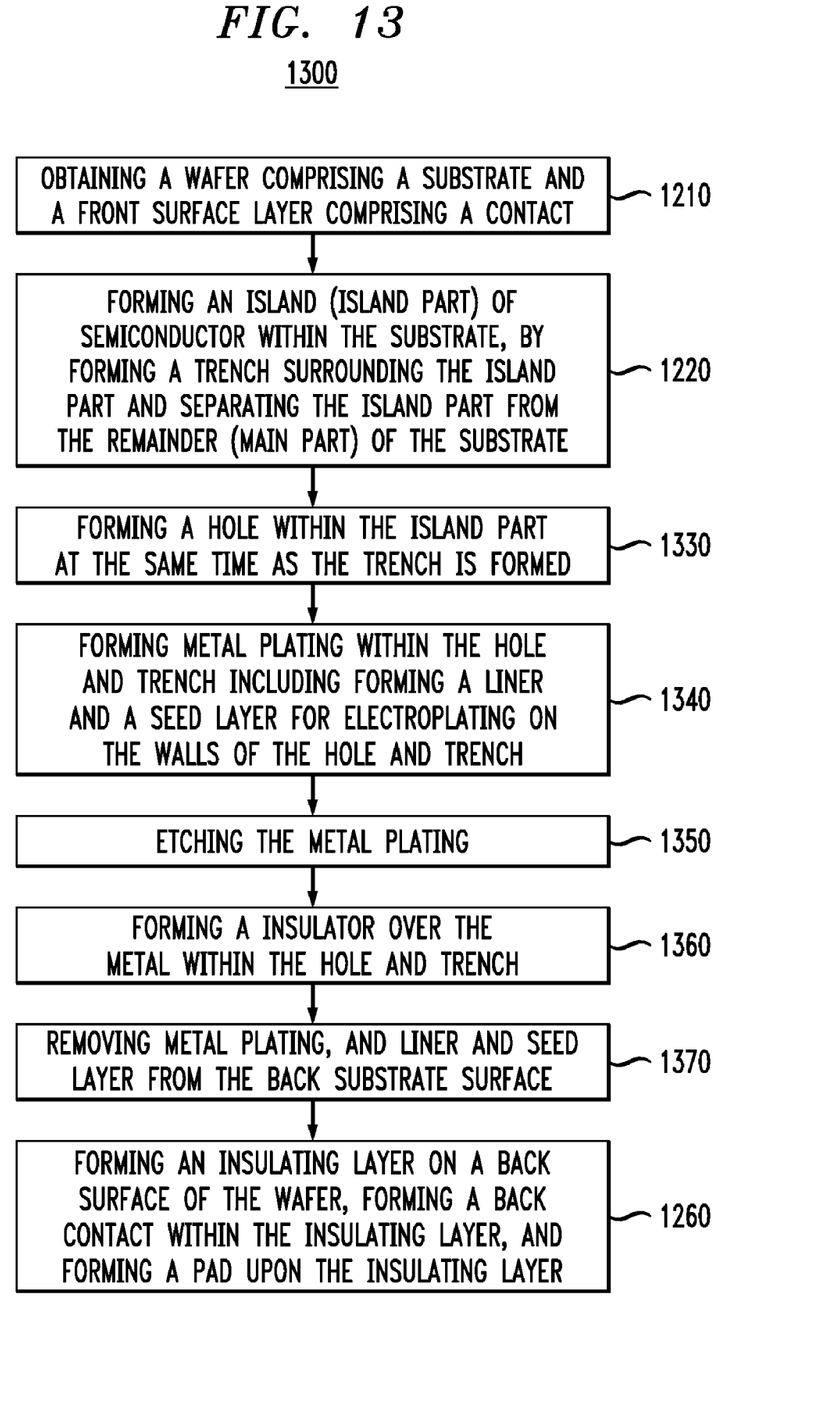
FIG. 13 details the steps of a first method for forming a through-via according to the first embodiment of the invention.
Figure 14:
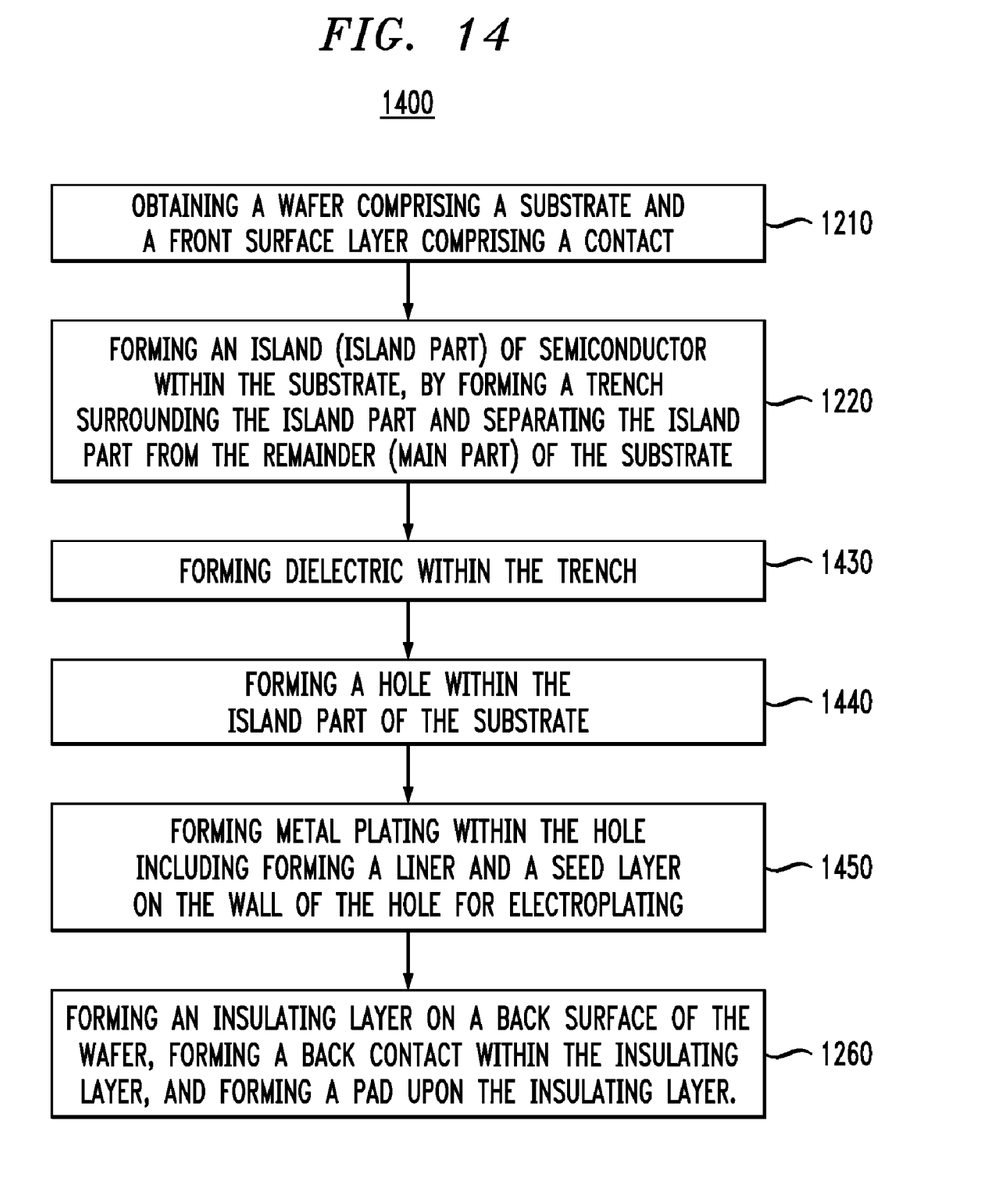
FIG. 14 details the steps of a second method for forming a through-via according to the second embodiment of the invention.

FIGS. 2 through 7 illustrate physical structures and process in forming a via, according to a first embodiment of the invention. A feature of the first embodiment of the invention is that it can be formed using only one mask and only one reactive-ion-etching. FIGS. 8 through 11 illustrate physical structures and process in forming a via, according to a second embodiment of the invention. FIG. 12 details the steps of a general method 1200 for forming a via, according to a general embodiment of the invention. FIG. 13 details the steps of a first method 1300 for forming a via, according to the first embodiment of the invention. FIG. 14 details the steps of a second method 1400 for forming a via, according to the second embodiment of the invention. Both the first and second embodiments start with the wafer 100 shown in FIG. 1. The via is formed after the front surface layer, including any wiring, devices and circuits, is formed. The via is coupled to the front contact within the front surface layer.

The general method 1200, the first method 1300 and the second method 1400 comprise a first step 1210 of obtaining the wafer 100 comprising the substrate 101 and the front surface layer 102 comprising the front contact 150. The first step 1210 occurs prior to any other steps within the general method 1200, the first method 1300 and the second method 1400.

In an alternate embodiment, an alternate to the first step 1210 is obtaining a first wafer comprising a first substrate. The first wafer is affixed to an external topside layer. The topside layer is not an integral part of the first wafer, but a layer attached to the first wafer, for example a second substrate comprising an insulator, silicon dioxide, silicon or other semiconductor bonded to the first wafer. The topside layer may comprise, for example, a second substrate upon which are affixed the entire first wafer or one or more portions of the first wafer, such as chips from the first wafer. Additionally, one or more portions of one or more additional wafers may optionally be affixed to the second substrate. The topside layer may comprise, for example, wiring connected to the affixed wafers or chips, such as wiring connected to a via formed according to methods of the present invention. The topside layer may be permanently affixed to the first substrate, for example, when the topside layer functions as a package substrate. Alternately, the topside layer may be temporarily affixed to the first substrate, for example, when the topside layer functions as a temporary fixture during wafer or chip processing. In the following description of the general method 1200, the first method 1300 and the second method 1400, for the alternate embodiment, references to the front surface layer 102 should be considered to apply to the topside layer.

The second step 1220 of the general method 1200, the first method 1300 and the second method 1400 is to form an island (island part) within the substrate 101 by forming a trench completely surrounding the island and separating the island from the remainder (main part) of the substrate 101. The trench extends through the substrate 101 from the back surface of the substrate 101 to the front surface of the substrate 101, but not through the front surface layer 102. However, it should be noted that in some cases the trench may extend well within, but not entirely through, the front surface layer 102. The trench is formed by, for example, reactive-ion etching, deep reactive-ion etching or wet etching. Etching is done from the back side of the substrate 101. It is to be noted that, in some embodiments, the front surface of the substrate 101 that abuts the trench is a bottom of an extension trench.

In one embodiment, the front surface layer 102, comprises an electrically insulating material which is adapted to at least partially control the depth of the trench by, for example, having a first etch rate of the electrically insulating material less than a second etch rate of the substrate 101. In this embodiment, if the bottom of the trench abuts the bottom of an extension trench having the electrically insulating material on the bottom of the extension trench, the electrically insulating material within the extension trench is adapted to at least partially control the depth of the trench.

In particular embodiments, the substrate 101 or a portion of the substrate 101 is conductive and the trench is formed, at least partially, within the conductive portion of the substrate 101. In this case, one purpose of the trench is to form an electrical insulating barrier between the island part and the main part of the substrate 101, so that the island part and the main part of the substrate 101 are electrically decoupled.

In the third step 1330 of the first method 1300, a hole is formed within the island at the same time that the trench is formed. The hole is formed by, for example, the same reactive-ion etch, deep reactive-ion etch, or wet etch used to form the trench. Etching is done from the back side of the substrate 101.

Figure 2:
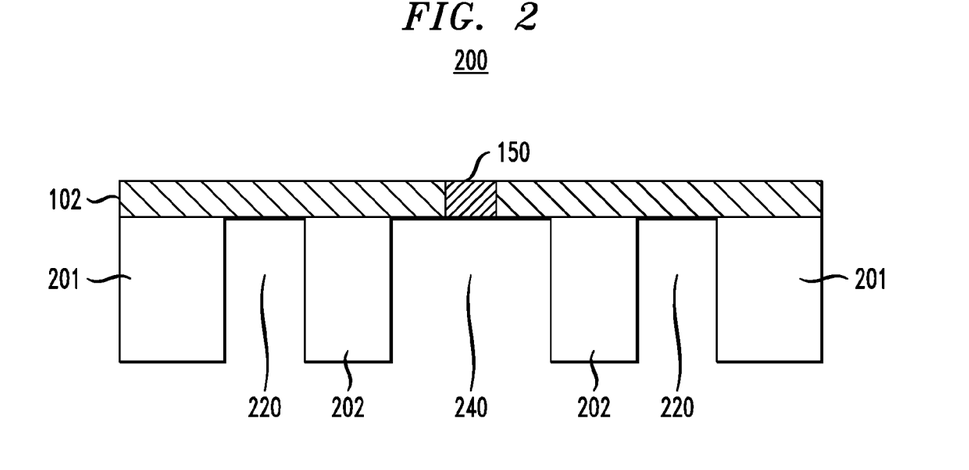
FIG. 2 illustrates a cross-section of a wafer after a trench, an island and a hole are formed, according to a first embodiment of the invention.

For the first embodiment, FIG. 2 illustrates a cross-section of a wafer 200 after a first trench 220, a first island 202 and a first hole 240 are formed, according to the first embodiment of the invention. In the first embodiment illustrated in FIGS. 2 through 7, the first trench 220 has an annular shape and the first hole 240 has a form of a cylinder. The first island 202, therefore, has a form of a cylindrical wall having some thickness. The remainder of the substrate (the first main part of the substrate 201) is outside of the first trench 220. Because in the first method 1300, the first hole 240 is formed at the same time as the first trench 220 is formed, a single mask may be used for the etching of the first hole 240 and the first trench 220. Additionally, only one reactive-ion etching is needed.

Figure 8:
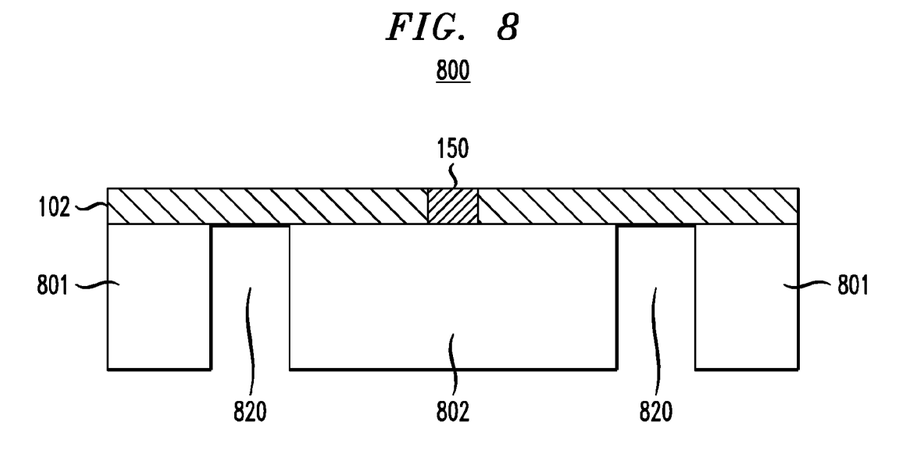
FIG. 8 illustrates a cross-section of a wafer after a trench and an island are formed, according to a second embodiment of the invention.

For the second embodiment, FIG. 8 illustrates a cross-section of a wafer 800 after the second trench 820 and the second island 802 are formed, according to the second embodiment of the invention. In the second embodiment illustrated in FIGS. 8 through 11, the second trench 820 has an annular shape. The second island 802, at this point, has a form of a solid cylinder. The remainder of the substrate (the second main part of the substrate 801) is outside of the second trench 820.

Figure 9:
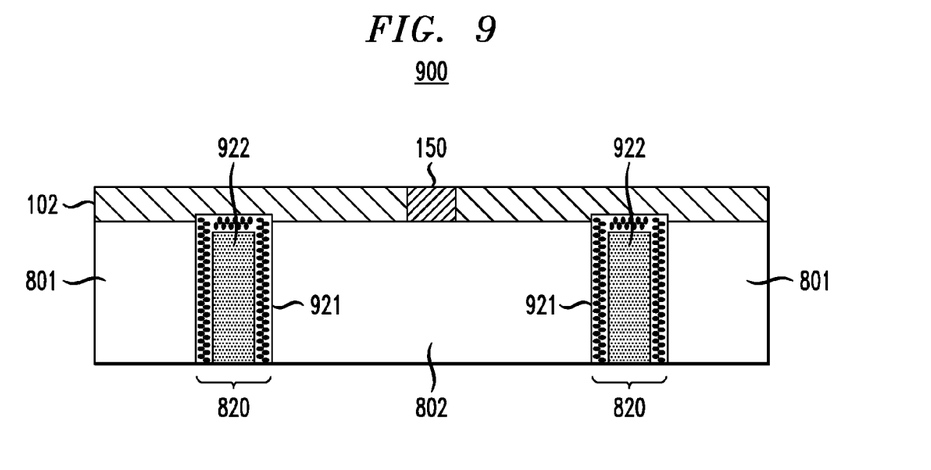
FIG. 9 illustrates a cross-section of a wafer after a dielectric has been formed in the trench, according to the second embodiment of the invention.

The third step 1430 of the second method 1400 comprises forming dielectric within the second trench 820. FIG. 9 illustrates a cross-section of a wafer 900 after the dielectric has been formed in the second trench 820, according to the second embodiment of the invention. In the embodiment shown, the dielectric comprises two dielectric parts, a first dielectric layer 921 and a second dielectric 922. The first dielectric layer 921 comprises, for example, a low-temperature oxide (e.g. silicon dioxide). The low-temperature oxide is typically formed by deposition at temperatures of 800 degrees Celsius or lower. The second dielectric 922 comprises, for example, silicon-dioxide, oxide, polyimide, underfill, resist, an organic insulator, low temperature co-fired ceramic paste, or a partial void. In another embodiment, a single dielectric fills the second trench 820. In any case, the second island 802 is electrically decoupled from the second main part of the substrate 801 by the second trench 820 which insulates the second island 802 from the second main part of the substrate 801.

Figure 10A:
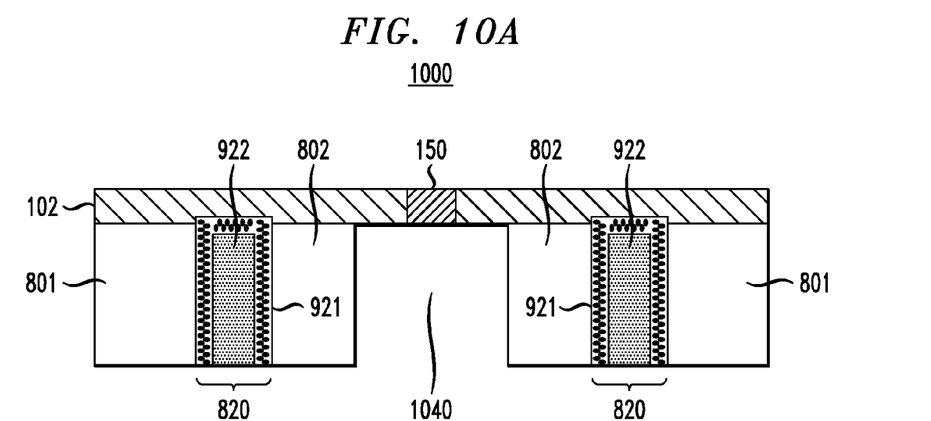
FIG. 10A illustrates a cross-section of a wafer after the formation of a hole, according to the second embodiment of the invention.

A third step 1230 of the general method 1200 and the fourth step 1440 of the second method 1400 comprise forming a hole within the island part. For the second method 1400, FIG. 10A illustrates a cross-section of a wafer 1000 after the formation of the second hole 1040, according to the second embodiment of the invention. The second hole 1040 has the shape of a cylinder. If the second hole 1040 is not too big in diameter, the second island 802 has a form of a cylindrical wall having some thickness. The second hole 1040 is formed by, for example, an etch step after the formation and filling of the second trench 820. The etch step comprises, for example, reactive-ion etching, deep reactive-ion etching, or wet etching.

Figure 10B:
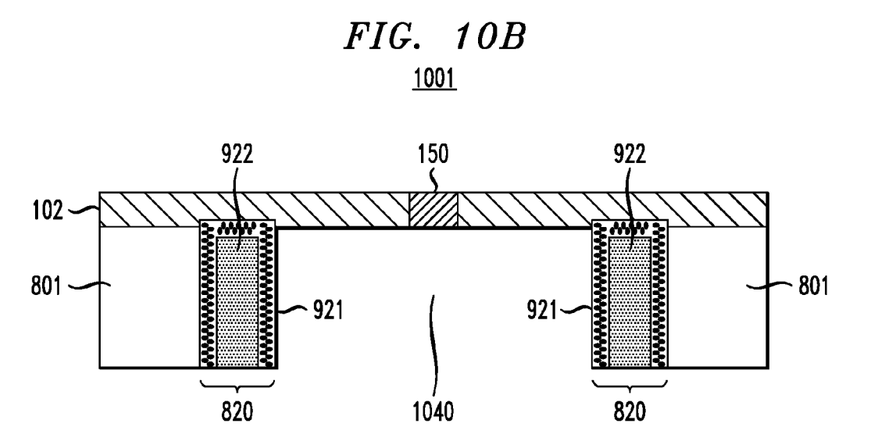
FIG. 10B illustrates a cross-section of a wafer after the formation of a hole, according to an alternate second embodiment in which the hole is formed by etching all of an island part of the substrate.

It is possible that the second hole 1040 could be formed by etching all of the second island 802, so that none of the second island 802 remains. FIG. 10B illustrates a cross-section of a wafer 1001 after the formation of the second hole 1040, according to an alternate second embodiment in which the second hole 1040 is formed by etching all of the second island 802. In the second embodiment, the wall of the second hole 1040 will be a dielectric formed within the trench 820, for example the first dielectric layer 921 formed in third step 1430 of the second method 1400. The alternate second embodiment comprises forming a dielectric on the sidewall of the second island 802, previously exposed within the trench, wherein the hole, formed after the forming of the dielectric, abuts the dielectric. Example etches for etching all of the second island 802 are a wet etch or etching with xenon hexafluoride ($XeF_6$).

The fourth step 1240 of the general method 1200, the fourth step 1340 of the first method 1300, and the fifth step 1450 of the second method 1400 comprises forming metal within the hole. In the first method 1300, a first metal is formed within the first hole 240. The first metal comprises a first metal plating. In the second method 1400, a second metal is formed within the second hole 1040. The second metal comprises a second metal plating.

Figure 11:
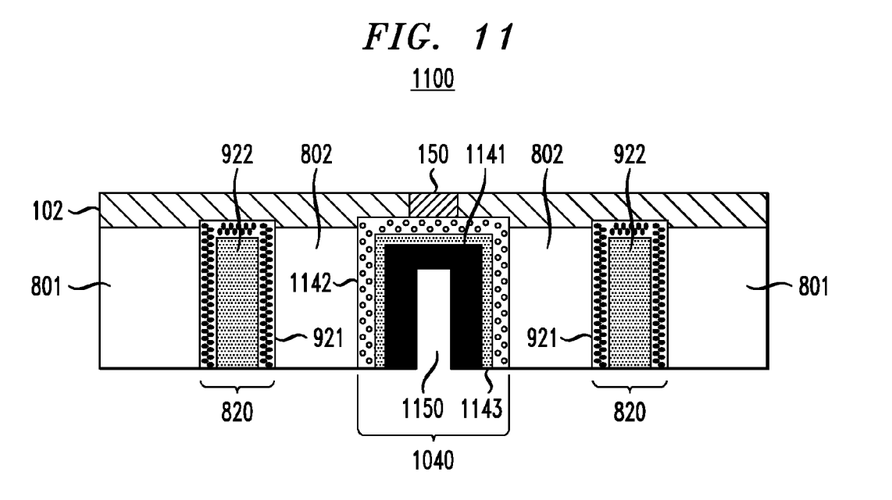
FIG. 11 illustrates a cross-section of wafer after the formation of metal within the hole, according to the second embodiment of the invention.

For the second method 1400, FIG. 11 illustrates a cross-section of a wafer 1100 after the formation of the second metal within the second hole 1040, according to the second embodiment of the invention. The second metal comprises the second metal plating 1141 formed by electro-plating. The formation of the second metal within the second hole 1040 comprises the electro-plating and forming a liner 1142 and a seed layer 1143 on the wall of the second hole 1040 prior to the electro-plating. If the second hole 1040 was formed by etching all of the second island 802, the liner 1142 and the seed 1143 are deposited onto dielectric formed within the trench 820. The second metal plating 1141 comprises, for example, copper plated by a copper damascene electro-plating process. The liner 1142 acts as a diffusion barrier between the second metal plating 1141 (e.g., copper plating) and the underlying semiconductor (e.g., silicon). The seed layer 1143 comprises, for example, copper seed. The seed layer 1143 acts as the cathode for the electro-plating. Optionally, small amounts of organic material can be added to the seed layer 1143 to increase the plating rate. Adding the organic material allows differential-rate plating, super-filling, super-conformal or bottom-up plating.

Figure 3:
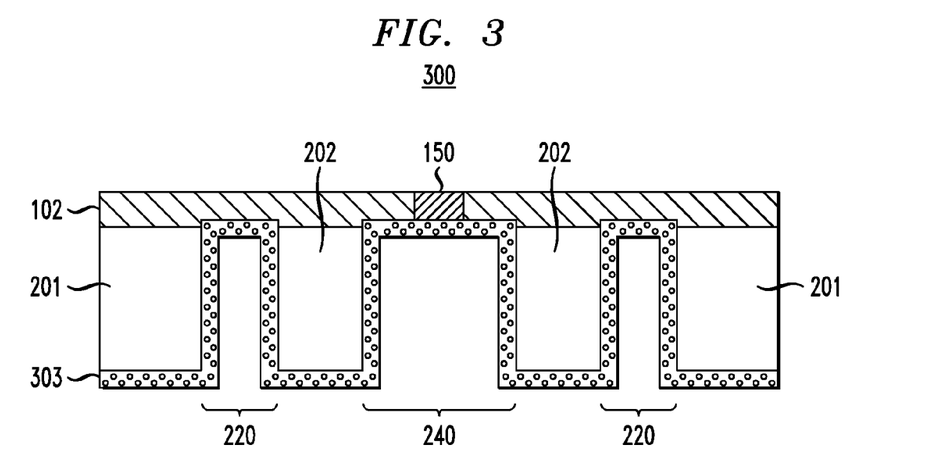
FIG. 3 shows a cross-section of a wafer after formation of a liner and a seed layer, according to the first embodiment of the invention.
Figure 4:
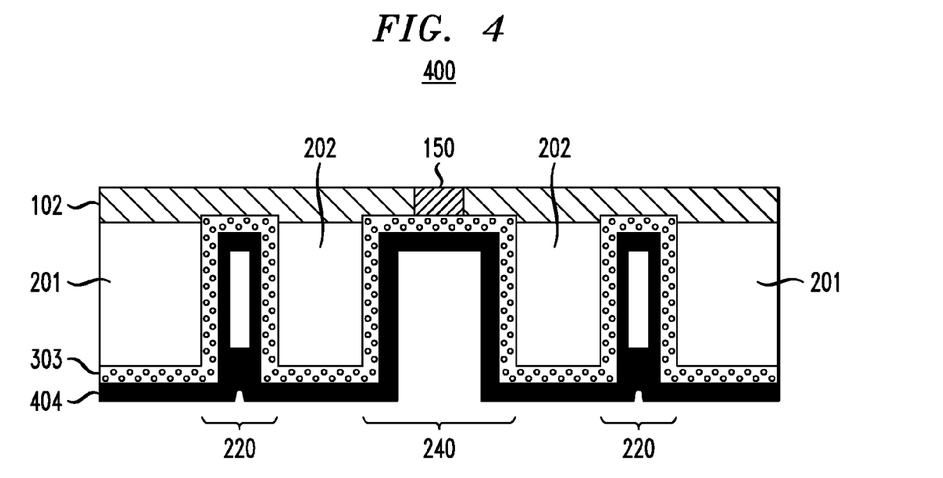
FIG. 4 shows a cross-section of a wafer after forming metal by electro-plating metal plating within the hole and within the trench, according to the first embodiment of the invention.

The fourth step 1340 of the first method 1300 further comprises forming the first metal within the first trench 220 and is illustrated in FIGS. 3 and 4. For the fourth step 1340 of the first method 1300, the first metal in the first trench 220 is formed at the same time and in the same way as the first metal is formed within the first hole 240, for example, formed by a damascene electro-plating process as described above. The formation of the first metal within the first hole 240 and first trench 220 comprises the electro-plating of a first metal plating 404 and forming a liner and seed layer 303 on at least the wall of the first hole 240 and first trench 220 prior to the electro-plating. FIG. 3 shows a cross-section of a wafer 300 after formation of the liner and seed layer 303, according to the first embodiment of the invention (for simplicity, the liner and the seed layer are illustrated as a dual-layer indicated in FIG. 3 by identifier 303). The liner and seed layer 303 is also formed on the back surface of the wafer on at least part of the first main part of the substrate 201 and at least part of the first island 202, as shown in FIG. 3. FIG. 4 shows a cross-section of a wafer 400 after forming the first metal by electro-plating the first metal plating 404 within at least the first hole 240 and the first trench 220, according to the first embodiment of the invention. The first metal plating 404 comprises, for example, metal plating formed by electro-plating. For example, the first metal plating 404 comprises copper. The first metal plating 404 is also formed, on top of the liner and seed layer 303, on the back surface of the wafer on at least part of the first main part of the substrate 201 and at least part of the first island 202, as shown in FIG. 4. The first metal plating 404 is formed on the back surface of at least a portion of the first main part of the substrate 201 and the first island 202 at the same time and in the same way as the first metal plating 404 is formed within the first hole 240 and within the first trench 220.

Figure 5:
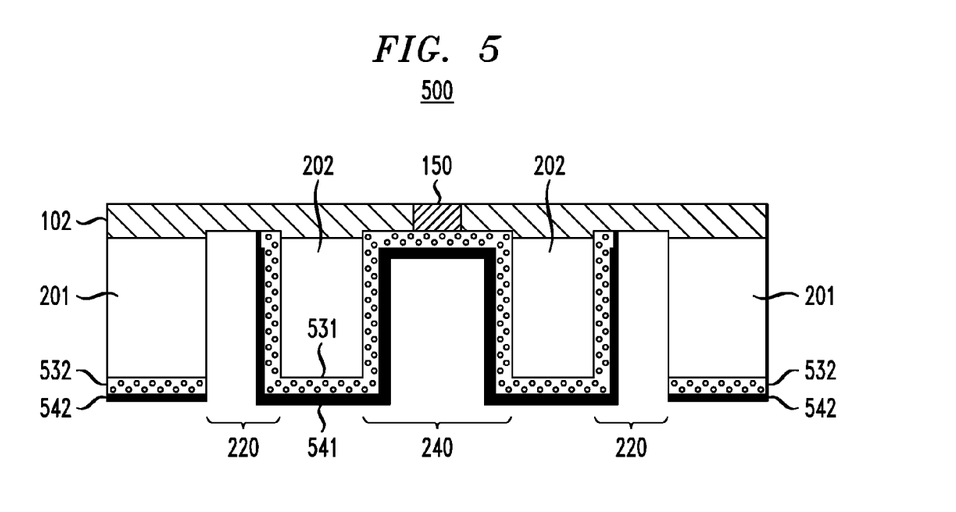
FIG. 5 shows a cross-section of a wafer after forming after etching the metal plating, according to the first embodiment of the invention.

The fifth step 1350 of the first method 1300 is etching the first metal plating 404. FIG. 5 shows a cross-section of a wafer 500 after etching the first metal plating 404 according to the first embodiment of the invention. By way of example, the first metal plating 404 is etched by a three etch process comprising a first electro-etch, a reactive-ion etch and a second electro-etch. The first electro-etch removes the first metal plating 404 on the bottom surface of the first trench 220, that is, the interior surface of the trench parallel to and closest to the front surface layer 102. The reactive-ion etch removes that portion of the liner and seed layer that is on the bottom surface of the trench, electrically decoupling a first remaining portion of the first metal plating 541, that remains at least within the first hole 240, from that portion of the first metal plating formed on the outside interior wall of the trench. The second electro-etch removes the portion of first metal plating that is on the outside interior wall of the trench.

An importance of the etch is that the etch electrically decouples a second remaining portion of the first metal plating 542, which is on the bottom surface of first main part of the substrate 201, from the first remaining portion of the first metal plating 541, which is outside of the first hole 240 on the back surface of the first island 202. More importantly, the etch electrically decouples the first remaining portion of the first metal plating 541 from the first main part of the substrate 201. After the etching of the liner and seed layer 303, a first liner and seed layer remaining portion 531 and a second liner and seed layer remaining portion 532 remain.

An option is to form a protective dielectric layer (not shown), prior to etching the first metal plating 404, over at least that portion of the first metal plating that is within the first hole 240. For, example a protective dielectric layer is deposited over the all of the exposed first metal plating 404. The protective dielectric layer on the first metal plating that is outside of the first hole 240 is removed by, for example, chemical-mechanical-polishing, leaving only the protective dielectric layer on the first metal plating within the first hole 240. The remaining portion of the protective dielectric layer protects the metal plating within the hole from being etched.

Figure 6:
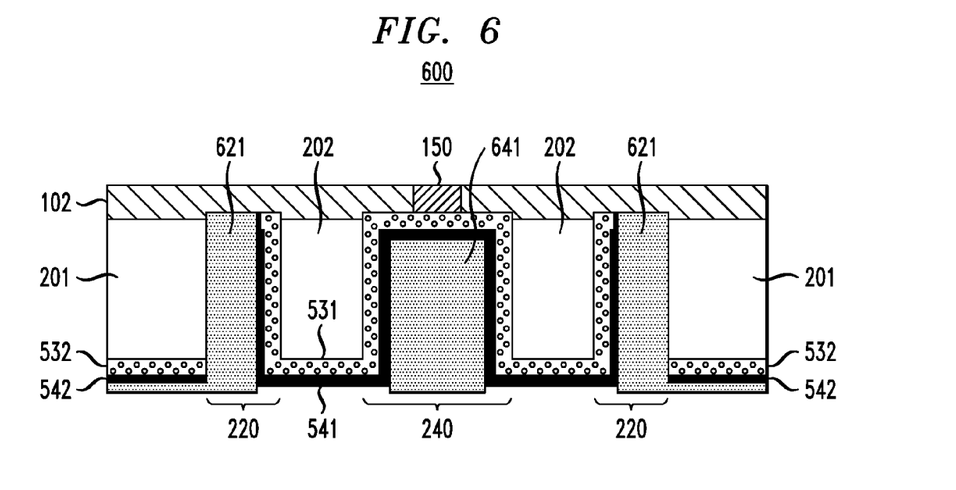
FIG. 6 shows a cross-section of a wafer after a dielectric has been formed within the trench and within the hole, according to the first embodiment of the invention.

The fifth step 1250 of the general method 1200 and the sixth step 1360 of the first method 1300 comprise forming a dielectric 621 over the metal within the trench. The sixth step 1360 of the first method 1300 further comprises forming a dielectric 641 over the metal within the first hole 240. For the first method 1300, FIG. 6 shows a cross-section of a wafer 600 after the dielectric has been formed within the first trench 220 and first hole 240, according to the first embodiment of the invention. The dielectric comprises, for example, silicon-dioxide, oxide, polyimide, underfill, resist, low temperature co-fired ceramic paste, an organic insulator, or a void. The dielectric may additionally be formed outside of the first hole 240 and the first trench 220, for example, on the back surface of the first main part of the substrate 201, as shown in FIG. 6, and/or on the back surface of the first island 202. The first island 202 is electrically decoupled from the first main part of the substrate 201 by the first trench 220 which insulates the first island 202 from the first main part of the substrate 201.

Optionally, for the second embodiment, a void 1150 at least partially surrounded by the second metal plating 1141, may be at least partially filled with dielectric. The void 1150 is shown is shown in FIG. 11 prior to at least partially filling with dielectric.

Figure 7:
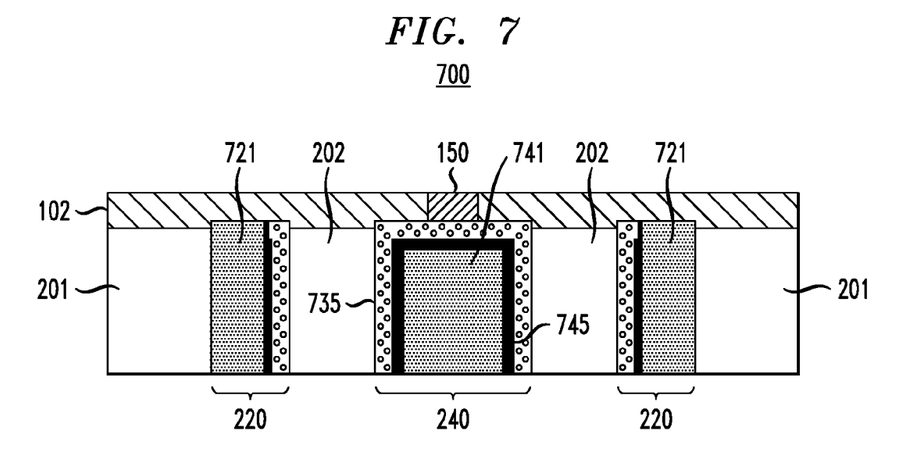
FIG. 7 illustrates a cross-section of a wafer after the removal of the metal plating and the seed layer from the back surface of the substrate, according to the first embodiment of the invention.

The seventh step 1370 of the first method 1300 comprises removing the metal plating and the liner and seed layer from the back surface of the substrate, that is, removing the first liner and seed layer remaining portion 531 that is on the back surface of the substrate, the second liner and seed layer remaining portion 532, the first remaining portion of the first metal plating 541 that is below the back surface of the substrate, and the second remaining portion of the first metal plating 542, as well as any residual oxide below the back surface of the substrate. The metal plating and the liner and seed layer are removed from the back surface of the substrate by, for example, chemical-mechanical polishing. FIG. 7 illustrates a cross-section of a wafer 700 after the removal of the metal plating and the liner and seed layer from the back surface of the substrate, according to the first embodiment of the invention.

Figure 15:
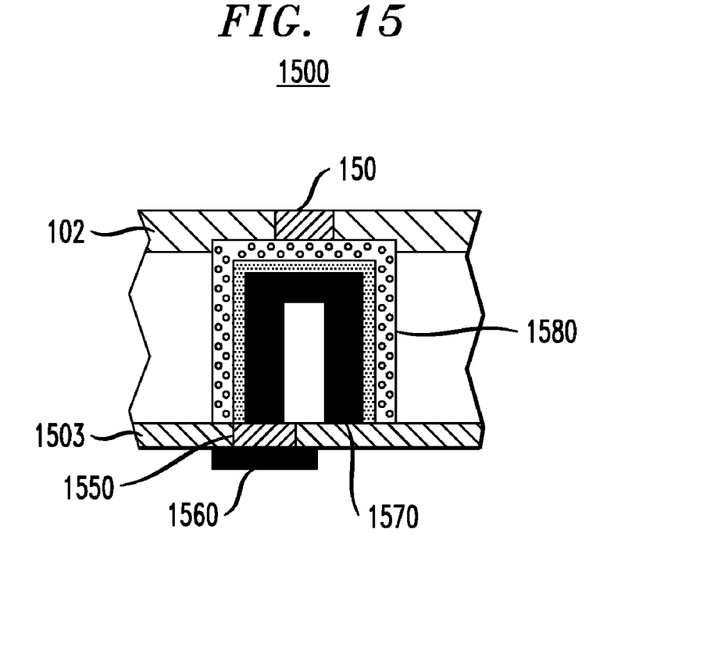
FIG. 15 shows a cross-section of a via of the invention coupled to a front contact and coupled to a back contact coupled to a pad, according to an embodiment of the invention.

FIG. 15 shows a cross-section of a wafer 1500 comprising a via 1580 of the invention contacted to a front contact 150 and a back contact 1550 coupled to a pad 1560 according to an embodiment of the invention. The final step 1260 of the general method 1200, the first method 1300 and the second method 1400 comprises forming an insulating layer 1503 on a back surface of the wafer, forming a back contact 1550 within the insulating layer 1503, and forming a pad 1560 upon or within the insulating layer 1503. The pad 1560 comprises metal, is conductive and is coupled to the back contact 1550 which is coupled to the metal portion 1570 of the via 1580. The pad 1560 functions as a back-of-the-wafer electrical contact coupled through the via 1580 which is also coupled to the front contact 150.

It should be noted that, after the electro-plating is completed, the liner and seed layer are conductive. Therefore, the liner and seed layer between the metal plating and the contact hole does not prevent electrical conduction between the metal plating and the contact hole.

Although the first and the second embodiments comprise cylindrical holes, within the substrate, containing the via, the invention is not so limited but can comprise holes of various shapes, such as, square, rectangular or oval. Although the first and the second embodiments comprise thick cylindrical-wall shaped island parts of the substrate, the invention is not so limited but can comprise island parts of various shapes. Although the first and the second embodiments comprise annular trenches, the invention is not so limited but can comprise trenches of various shapes.

It is to be appreciated that because dies are diced from wafers, dies comprising one or more vias according to embodiments of the present invention are considered part of the present invention.

At least a portion of the techniques of the present invention, for example, the techniques illustrated in FIGS. 3-15, may be implemented in one or more integrated circuits. In forming integrated circuits, die are typically fabricated in a repeated pattern on a surface of a semiconductor wafer. Individual die are cut or diced from the wafer, then packaged as integrated circuits. One skilled in the art would know how to dice wafers and package die to produce integrated circuits. Integrated circuits so manufactured are considered part of this invention.

Figure 16:
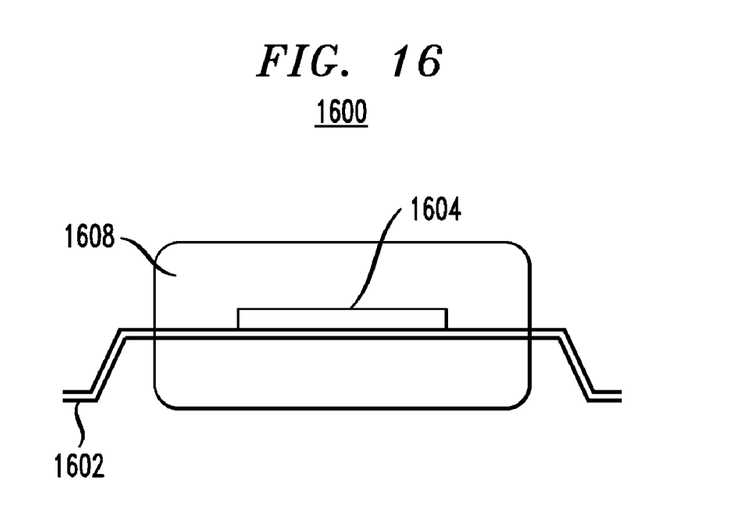
FIG. 16 is a cross-sectional view depicting an exemplary packaged integrated circuit, according to an embodiment of the present invention.

FIG. 16 is a cross-sectional view depicting an exemplary packaged integrated circuit 1600 according to an embodiment of the present invention. The packaged integrated circuit 1600 comprises a leadframe 1602, a die 1604 attached to the leadframe, and a plastic encapsulation mold 1608. Although FIG. 16 shows only one type of integrated circuit package, the invention is not so limited; the invention may comprise an integrated circuit die enclosed in any package type.

The die 1604 includes a device described herein, and may include other structures or circuits. For example, the die 1604 includes at least one via according to embodiments of the invention.

An integrated circuit in accordance with the present invention can be employed in applications, hardware and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for forming a via in a portion of a semiconductor wafer comprising a substrate, the method comprising the steps of:

forming a trench surrounding a first part of the substrate such that the first part is separated from a second part of the substrate, wherein the trench extends through the substrate;

forming a hole through the substrate within the first part; and forming a first metal within the hole, wherein the first metal extends from a front surface of the substrate to a back surface of the substrate, and wherein the via comprises the hole and the first metal;

forming a second metal within the trench, wherein the forming of the first metal and the forming of the second metal comprise: forming metal plating at least within the hole and the trench; and etching the metal plating, wherein, after the etching, the metal plating is discontinuous from a first interior wall of the trench to a second interior wall of the trench, wherein the second interior wall is closer to the hole than the first interior wall;

wherein the etching of the metal plating comprises:

a first electro-etching operation that removes at least a portion of the metal plating adjacent to at least a portion of a bottom surface of the trench;

a reactive-ion etching operation that removes at least a portion of a seed layer adjacent to the at least a portion of the bottom surface of the trench, and electrically decouples the first metal from that portion of the second metal formed on the first interior wall of the trench; and a second electro-etching operation that removes at least the portion of the second metal formed on the first interior wall of the trench.

* * * * *